United States Patent [19]

Tanaka

[11] Patent Number: 5,414,917
[45] Date of Patent: May 16, 1995

[54] METHOD OF MANUFACTURING PIEZOELECTRIC RESONATOR CHIPS

[75] Inventor: Yasuhiro Tanaka, Nagaokakyo, Japan

[73] Assignee: Murata Manufacturing Co., Ltd., Kyoto, Japan

[21] Appl. No.: 137,630

[22] Filed: Oct. 15, 1993

[30] Foreign Application Priority Data

Oct. 19, 1992 [JP] Japan ................................. 4-306438

[51] Int. Cl.⁶ .............................................. H10L 41/22
[52] U.S. Cl. ..................................... 29/25.35; 310/340
[58] Field of Search ................... 29/25.35, 416, 856, 29/417; 310/320, 322, 340, 344, 348, 365-368

[56] References Cited

U.S. PATENT DOCUMENTS

| | | | |
|---|---|---|---|
| 3,766,616 | 10/1973 | Staudte | 29/25.35 |
| 4,191,905 | 3/1980 | Yasuda et al. | 310/344 |
| 4,445,256 | 5/1984 | Huguenin et al. | 310/348 X |
| 4,572,981 | 2/1986 | Zola | 29/25.35 X |

FOREIGN PATENT DOCUMENTS

| | | | |
|---|---|---|---|
| 62-37438 | 3/1987 | Japan | 29/25.35 |
| 23995 | 11/1990 | Japan | 29/25.35 |
| 327610 | 2/1991 | Japan | 29/25.35 |
| 4102314 | 9/1992 | Japan | 29/25.35 |
| 4247708 | 9/1992 | Japan | 29/25.35 |

*Primary Examiner*—Peter Dungba Vo
*Attorney, Agent, or Firm*—Ostrolenk, Faber, Gerb & Soffen

[57] ABSTRACT

A piezoelectric resonator includes a mother resonator element which is fixed on a bottom of a continuous storing groove which is formed in a mother base plate. An upper opening of the storing groove is covered with a mother cover plate, so that the mother base plate, the mother cover plate and the mother resonator element are simultaneously cut along a direction perpendicular to a lengthwise direction of the storing groove to form intermediate chips. Side openings of each of the intermediate chips are covered with side plates, and thereafter external electrodes are formed on outer surfaces of each of the completed chips.

15 Claims, 6 Drawing Sheets

METHOD OF MANUFACTURING PIEZOELECTRIC RESONATOR CHIPS

BACKGROUND OF THE INVENTION

The present invention relates to a chip type piezoelectric resonator and a manufacturing method thereof.

In a conventional chip type piezoelectric resonator, a resonator element is inserted in a concave portion of a box-type case, and bonded to the case by conductive adhesive. The concave portion of the case is provided with internal electrodes on inner surfaces of the ends of the concave portion. The internal electrodes are connected with electrodes of the resonator element. The concave portion has a deeper concave portion in its central part for defining a vibration space between the case and the resonator element. A cover is bonded to an upper surface of the case to seal the interior of the case. Thereafter external electrodes are provided on outer surfaces of the case and the cover, to be connected to the internal electrodes.

The aforementioned piezoelectric resonator is manufactured by the following method: first, a number of concave portions are formed in an upper surface of a mother plate, and internal electrodes are formed on both ends of each of the concave portions. Next, resonator elements are inserted one by one in the respective concave portions, so that both end portions of the resonator elements can be bonded to the ends of the concave portions by conductive adhesive. Thus, electrodes of the resonator elements are connected with the internal electrodes. Then, a mother plate cover is bonded to an upper surface of the mother plate to seal the concave portions. Thereafter, the mother plates are integrally cut into independent chips. Each independent chip is then provided with an input external electrode and an output external electrode to be connected with the internal electrode on the outer surface of the chip.

If necessary, a ground electrode may also be formed in addition to the input and the output electrodes.

However, the aforementioned manufacturing method is inferior because the resonator elements are inserted one by one in the concave portions of the mother plate and the conductive adhesive is supplied to the respective concave portions one by one. In particular, it is extremely difficult to correctly insert such small-sized resonator elements, which are several millimeters in length for example, in the very small concave portions. Further, because the adhesive must be applied to both ends of each concave portion alone, it is necessary to apply the conductive adhesive twice to every concave portion. In addition, clearances must be defined between the inner surfaces of the concave portions and the resonator elements in order to smoothly insert the elements, which prevents further miniaturization.

SUMMARY OF THE INVENTION

Accordingly, an object of the present invention is to provide a miniature chip type piezoelectric resonator at a low cost.

Another object of the present invention is to provide a method of manufacturing a chip type piezoelectric resonator, which simplifies the assembling process and reduces the manufacturing cost.

The piezoelectric resonator according to the present invention includes a resonator element having a piezoelectric ceramic substrate, vibrating electrodes which are oppositely formed on both major surfaces thereof, and lead electrodes which extend thereon from the vibrating electrodes toward opposing end portions of the substrate. The resonator element is inserted in a storing groove which is formed on the upper surface of a base plate extending from one side to the other side surfaces thereof, so that both end portions of the resonator element can be fixed to the storing groove by conductive adhesive. Thus, the lead electrodes of the resonator element are connected with internal electrodes which extend from both end portions of the bottom of the groove toward upper surfaces of end walls of the base plate. The upper opening of the storing groove is covered with a cover plate, and both side openings of the storing groove are covered with two side plates. After the cover and side plates are fixed to the base plate, external electrodes are formed on outer surfaces thereof to be connected with the internal electrodes.

According to the present invention, as hereinabove described, the resonator element is stored in the storing groove which extends on the upper surface of the base plate from one side to the other side surfaces, and the upper and side surfaces thereof are sealed with the cover and the side plates. Thus, it is possible to miniaturize the piezoelectric resonator without having to provide large clearances between the resonator element and the respective sealing plates. Further, because the respective components can be produced with constant sectional shapes, it is possible to simplify the shape of the piezoelectric resonator and reduce the manufacturing cost.

In a method of manufacturing a piezoelectric resonator according to the present invention, a mother resonator element is first prepared from a piezoelectric ceramic substrate and vibrating electrodes are oppositely formed on both major surfaces of the substrate. Lead electrodes are formed to extend on the substrate from the vibrating electrodes toward the opposing ends of the substrate. A storing groove is formed to be continuous on an upper surface of a mother base plate, and internal electrodes are formed extending from end portions of the bottom of the storing groove toward upper surfaces of end walls of the mother base plate. Then, both end portions of the mother element are fixed onto the bottom of the storing groove with conductive adhesive to connect the lead electrodes of the mother element with the internal electrodes of the mother base plate. The conductive adhesive may include an adhesive sheet in addition to conductive paste. Then, a mother cover plate is bonded on the upper surface of the mother base plate, so as to obtain a unit X. The unit X is then cut along a direction perpendicular to a lengthwise direction of the storing groove and in a single chip width so as to obtain intermediate chips. Then two side plates are bonded to side surfaces of each of these chips where the storing groove is opened, thereby obtaining completed chips. At this time, clearances are preferably defined between these side plates and the resonator element, in order to provide vibration spaces. After the side plates are bonded, external electrodes are formed on outer surfaces of the completed chips, so that the external electrodes are connected with the lead electrodes of the resonator element through the internal electrodes.

According to the manufacturing method of the present invention, the mother base plate, the mother resonator element and the mother cover plate as integrated in the unit X are cut into chips simultaneously, thereby improving mass productivity and providing for uniform quality of the resulting products. Further, because an operation of inserting small-sized elements into very small concave portions is eliminated, working efficiency is improved.

When the mother resonator element is fixed to the mother base plate, the conductive adhesive may be previously applied on the internal electrodes in the form of thin films, or sheet-type conductive adhesives may be pasted thereto so that the conductive adhesives can be prevented from flowing to the vibrating electrodes or jutting out from the storing groove at the time of fixing the mother element.

According to the present invention, the manufacturing method can be modified as follows: first a plurality of storing grooves are formed in parallel on the upper surface of the mother base plate, and a mother resonator element is stored and fixed in each of the storing grooves, and then the upper surface of the mother base plate is covered with a mother cover plate, so as to obtain a first unit $Y_1$. Next, this unit $Y_1$ is cut in a direction perpendicular to a lengthwise direction of the storing grooves and in a single chip width, so as to form a second unit $Y_2$. Then two mother side plates are bonded to both side surfaces of the second unit $Y_2$ where the storing grooves are opened, so as to obtain a third unit $Y_3$. Thereafter, this unit $Y_3$ is cut in a direction parallel to the lengthwise direction of the storing grooves in single chip length to obtain completed chips, and external electrodes are formed on outer surfaces of each of the completed chips so as to be connected with the internal electrodes.

In this embodiment, it is possible to simultaneously obtain a number of piezoelectric resonators by applying a plurality of mother resonator elements to a single mother base plate, whereby mass productivity is further improved.

According to the present invention, the manufacturing method can be further modified as follows: the upper surface of the mother base plate with a plurality of storing grooves may be covered with another mother base plate in place of the mother cover plate so that the mother base plates are vertically layered one after another, so as to obtain a first layered unit $Z_1$. Next, the as-obtained first layered unit $Z_1$ is cut in a direction perpendicular to the lengthwise direction of the storing groove and in a single chip width, to form a second layered unit $Z_2$. Then two mother side plates may be bonded to both side surfaces of the unit $Z_2$ where the storing grooves are opened, so as to obtain a third layered unit $Z_3$. Thereafter, this unit $Z_3$ is cut in directions parallel to the lengthwise direction of the storing grooves and in a single chip length and in a single chip height to obtain completed chips.

In this case, it is further possible to improve mass productivity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
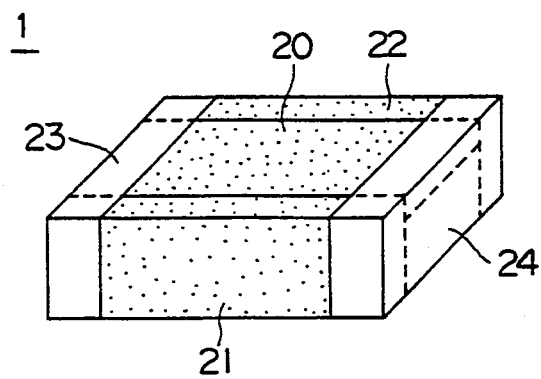
FIG. 1 is a perspective view showing a piezoelectric resonator according to a first embodiment of the present invention.
Figure 2:
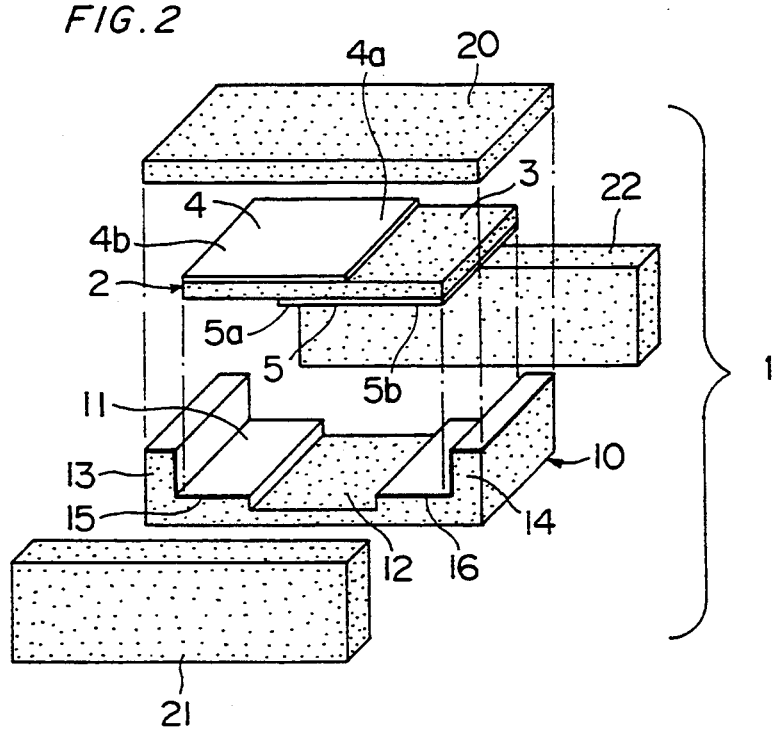
FIG. 2 is an exploded perspective view of the piezoelectric resonator shown in FIG. 1.

FIGS. 1 and 2 show a piezoelectric resonator 1 according to a first embodiment of the present invention.

As shown in FIGS. 1 and 2, the piezoelectric resonator 1 is formed by a resonator element 2, a base plate 10, a cover plate 20, side plates 21 and 22. The resonator element 2 is fixed inside of the base plate 10 and the cover plate 20 is bonded to an upper surface of the base plate 10, and the side plates 21 and 22 are bonded to both side surfaces of the as-bonded base and cover plates 10 and 20. Thus, the resonator element 2 are enclosed with the four plates 10 and 20–22.

The resonator element 2 according to this embodiment is an element of energy trapping type vibrating in the thickness shear slide mode including an elongated piezoelectric ceramic substrate 3 and electrodes 4 and 5 which are formed on front and back major surfaces thereof to be partially opposed to each other at a central portion of the substrate 3. The electrodes 4 and 5 are extended to the opposing end portions of the substrate 3 so as to form vibrating electrodes 4a and 5a at the opposing area and lead electrodes 4b and 5b at the extended portions, respectively.

A storing groove 11 which extends from one side surface to the other side surface of the base plate 10 is formed on the upper surface thereof, and a spacing groove 12 is formed on a central portion of the bottom of the storing groove 11 in the same direction. The spacing groove 12 is adapted to define cavities around the vibrating electrode 5a of the resonator element 2. The storing groove 11, which has a width and a depth capable of storing the resonator element 2, is provided with internal electrodes 15 and 16 extending from both end bottoms thereof toward upper surfaces of end walls 13 and 14 of the base plate 10. Both end portions of the resonator element 2 are fixed to the both end bottoms of the storing groove 11 with conductive adhesives (not shown), so that the internal electrodes 15 and 16 are connected with the lead electrodes 4b and 5b, respectively.

The plates 10 and 20-22 are preferably prepared from an insulating material such as ceramics or resin, whose thermal expansion coefficient is substantially equivalent to that of the resonator element 2. Simple flat plates are used for the cover and the side plates 20-22.

External electrodes 23 and 24 are formed on both end portions of the outer surface of the plates 10 and 20-22 which enclose the resonator element 2, as shown in FIG. 1. These external electrodes 23 and 24 are connected with the internal electrodes 15 and 16, which are drawn out toward end surfaces of the base plate 10. Thus, the external electrodes 23 and 24 are connected with the lead electrodes 4b and 5b of the resonator element 2 through the internal electrodes 15 and 16.

A method of manufacturing the aforementioned piezoelectric resonator 1 is now described with reference to FIGS. 3 and 4.

Figure 3:
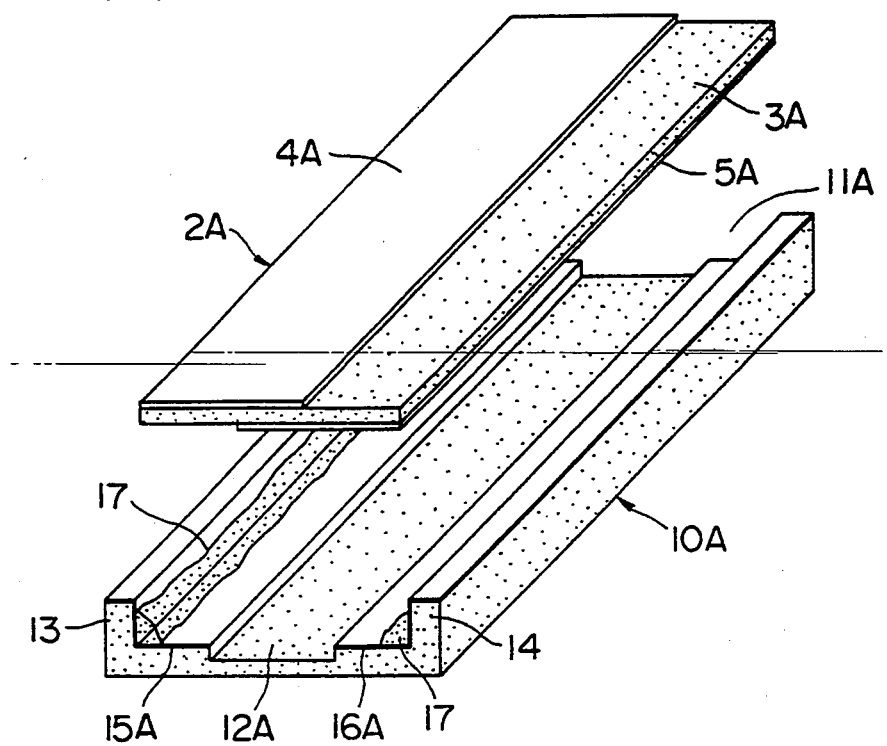
FIG. 3 is an exploded perspective view showing a step of manufacturing the piezoelectric resonator shown in FIG. 1.

As shown in FIG. 3, a mother resonator element 2A including a plurality of resonator elements 2 includes a piezoelectric ceramic substrate 3A, and electrodes 4A and 5A which are continuously formed on front and rear surfaces of the substrate 3A along its longitudinal direction. A mother base plate 10A is provided in its upper surface with a storing groove 11A which continuously extends along its longitudinal direction and with a spacing groove 12A which also extends in the same direction in the central portion of the storing groove 11A. Internal electrodes 15A and 16A, which extend from both end bottoms of the storing groove 11a toward upper surfaces of end walls 13 and 14, are formed along the overall length of the mother base plate 10A. Conductive adhesive 17 is applied to the both end bottoms of the storing groove 11A, so that the mother element 2A is placed thereon. Thus, the mother element 2A is fixed to the mother base plate 10A, and the electrodes 4A and 5A are simultaneously connected with the internal electrodes 15A and 16A, respectively.

Figure 4:
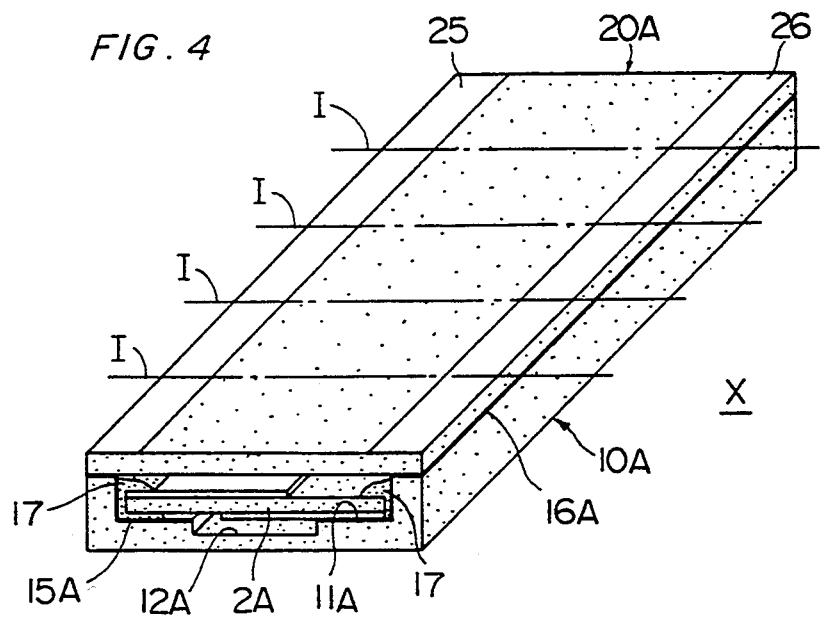
FIG. 4 is a perspective view showing a step following the step of FIG. 3.

Then, as shown in FIG. 4, a mother cover plate 20A is bonded to an upper surface of the mother base plate 10A for covering the storing groove 11A, so as to obtain a unit X. Auxiliary electrodes 25 and 26 may be previously formed on upper end surfaces of the mother cover plate 20A.

Next, the unit X is cut in a direction perpendicular to a lengthwise direction of the storing groove 11A and in a single chip width along the lines I—I appearing in FIG. 4, so as to obtain intermediate chips. At this time, the mother element 2A is also cut together with the mother plates 10A and 20A.

Thereafter, side plates 21 and 22 are bonded to both side surfaces of each of these chips where the storing groove 11A is opened, as shown in FIG. 2, so as to obtain completed chips. At this time, clearances may be defined between inner surfaces of the side plates 21 and 22 and the vibrating electrodes 4A and 5A of the resonator element 2. Thereafter, external electrodes 23 and 24 are formed on outer surfaces of the completed chips so as to be connected with the internal electrodes 15 and 16 and the auxiliary electrodes 25 and 26, thereby completing a piezoelectric resonator 1.

In the method according to this embodiment, since the unit X is cut into chips, it is not necessary to independently insert small-sized resonator elements into very small concave portions or to apply adhesive to independent concave portions. Thus, it is possible to reduce the manufacturing cost by improved mass productivity. Further, clearances between the side plates and the resonator element can be reduced, to enable miniaturization of the piezoelectric resonator.

The aforementioned manufacturing method can be modified when necessary. When the side plates 21 and 22 are bonded to the base and the cover plates 10 and 20, vibrating cavities can be formed by a method of etching or scraping side portions of the vibrating electrodes 4a and 5a, a method of defining clearances through adhesive, or a method of providing concave portions in inner surfaces of the side plates 21 and 22 corresponding to cavities.

FIGS. 5 to 8 show a manufacturing method according to a second embodiment of the present invention.

Figure 5:
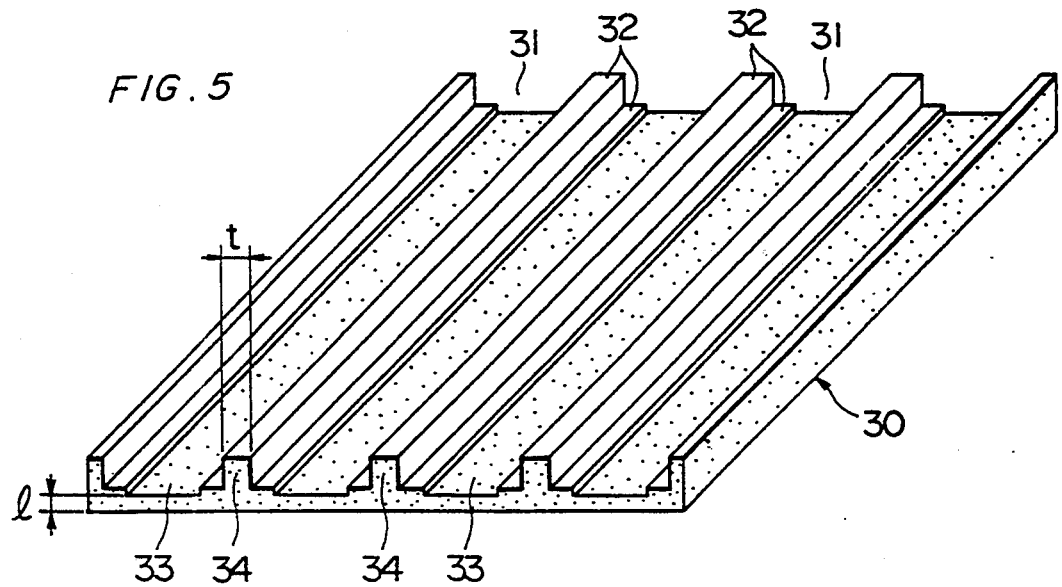
FIG. 5 is a perspective view showing a mother base plate which is used in a manufacturing method according to a second embodiment of the present invention.

Referring to FIG. 5, according to this embodiment, a mother base plate 30 has a plurality of storing grooves 31 which are formed in parallel with each other for receiving a plurality of mother elements, and internal electrodes 32 extend from both end portions of the bottom of the storing grooves 31 toward upper surfaces of the mother base plate 30. A spacing groove 33 is formed on a central portion of the bottom of each groove 31, for defining vibration space.

Figure 6:
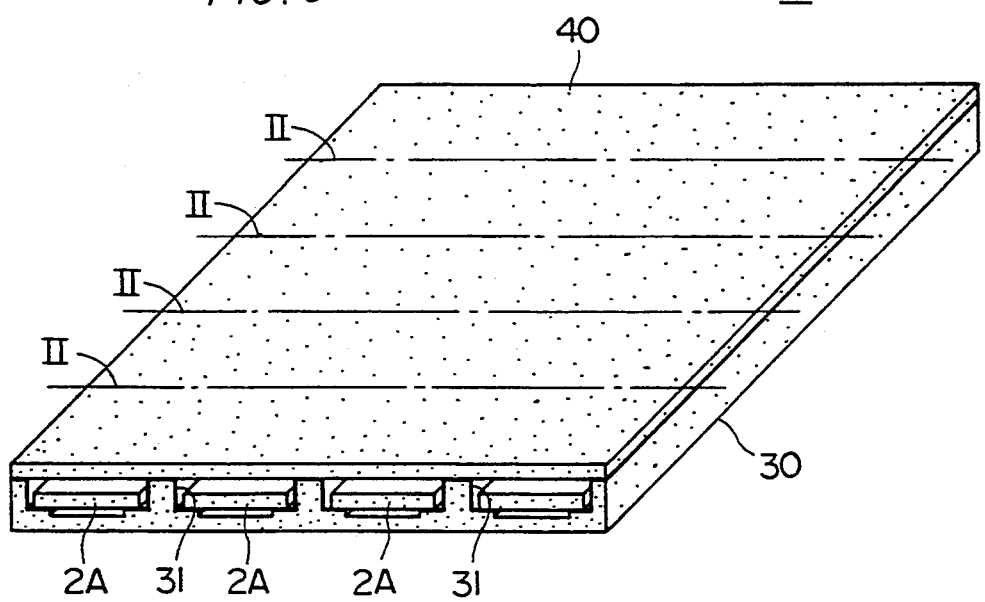
FIG. 6 is a perspective view showing a manufacturing step using the mother base plate shown in FIG. 5.
Figure 7:
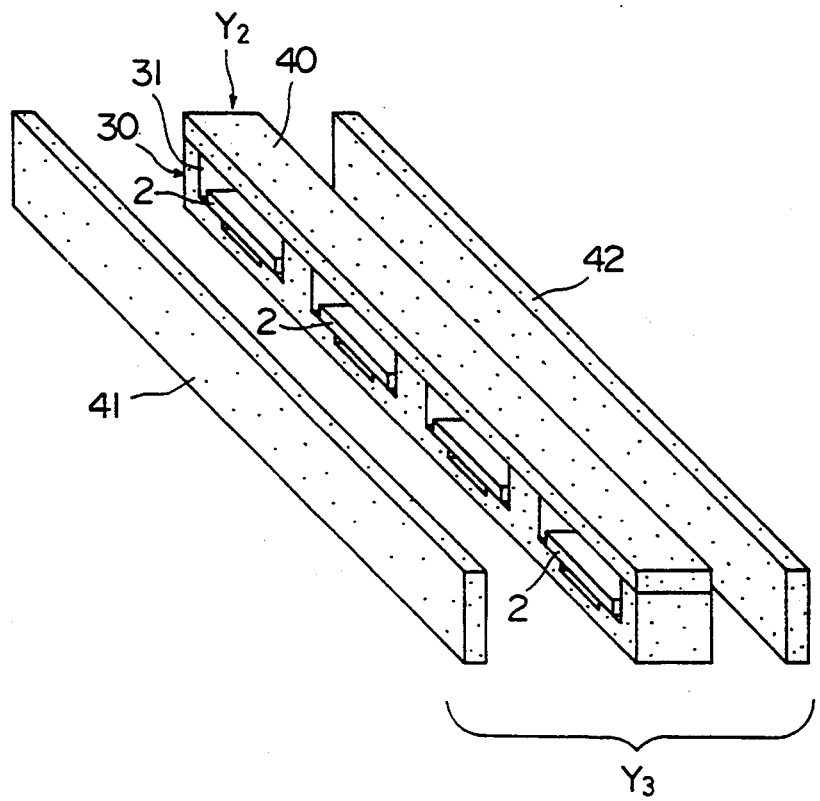
FIG. 7 is an exploded perspective view showing a step following the step of FIG. 6.

As shown in FIG. 6, a mother resonator element 2A is stored in each storing groove 31 and fixed by conductive adhesive, and then a mother cover plate 40 is bonded on the upper surface of the mother base plate 30, so as to obtain a first unit $Y_1$. Next, the as-obtained unit $Y_1$ is cut in a direction perpendicular to a lengthwise direction of the storing grooves 31 and in a single chip width along the lines II—II so as to obtain second units $Y_2$ as shown in FIG. 7. Then elongated mother side plates 41 and 42 are bonded to both side surfaces of each unit $Y_2$ so as to obtain a third unit $Y_3$. At this time, vibration spaces are defined between these side plates 41 and 42 and the element 2.

Figure 8:
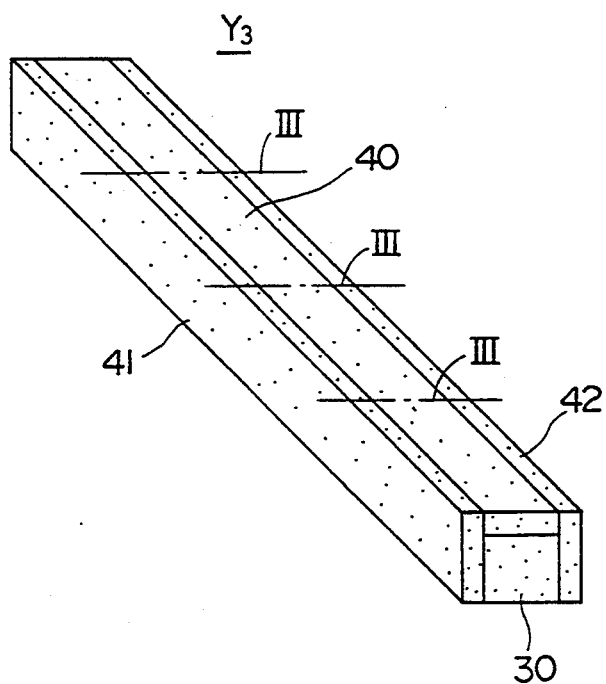
FIG. 8 is a perspective view showing a step following the step of FIG. 7.

Thereafter, as shown in FIG. 8, the third unit $Y_3$ is cut in a direction parallel to the storing grooves 31 and in a single chip length along the lines III—III, thereby obtaining completed chips. And external electrodes are formed on outer surfaces of each of the completed chips, thereby a piezoelectric resonator as shown in FIG. 1 is completed.

Although the elongated mother side plates 41 and 42 are bonded to both side surfaces of each unit $Y_2$ in the above-mentioned embodiment, wide side plates may alternatively be used if a plurality of units $Y_2$ may be layered one after another without being bonded and cut in directions parallel to the storing grooves 31 in a single chip width and in a single chip height in order to obtain completed chips.

Figure 9:
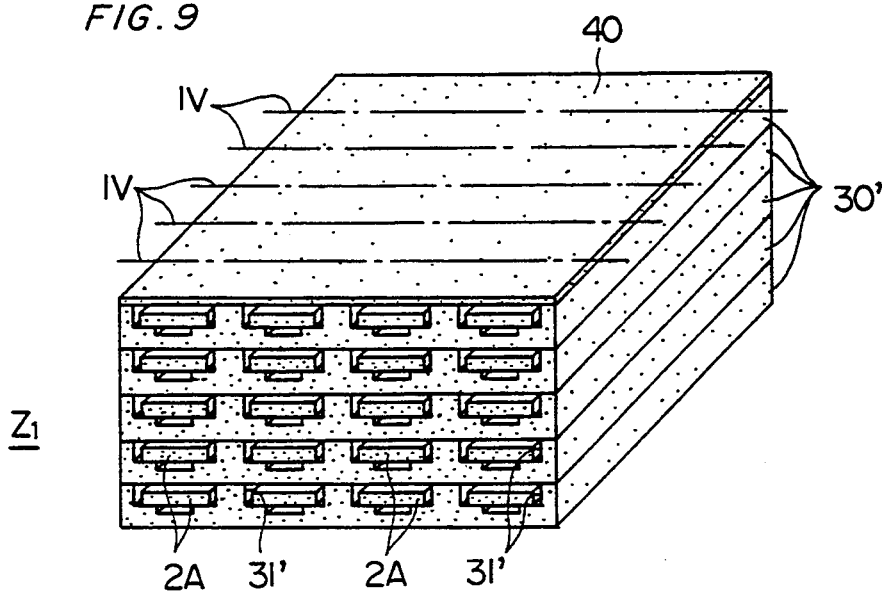
FIG. 9 is a perspective view showing a manufacturing method according to a third embodiment of the present invention employing the mother base plate shown in FIG. 5.
Figure 10:
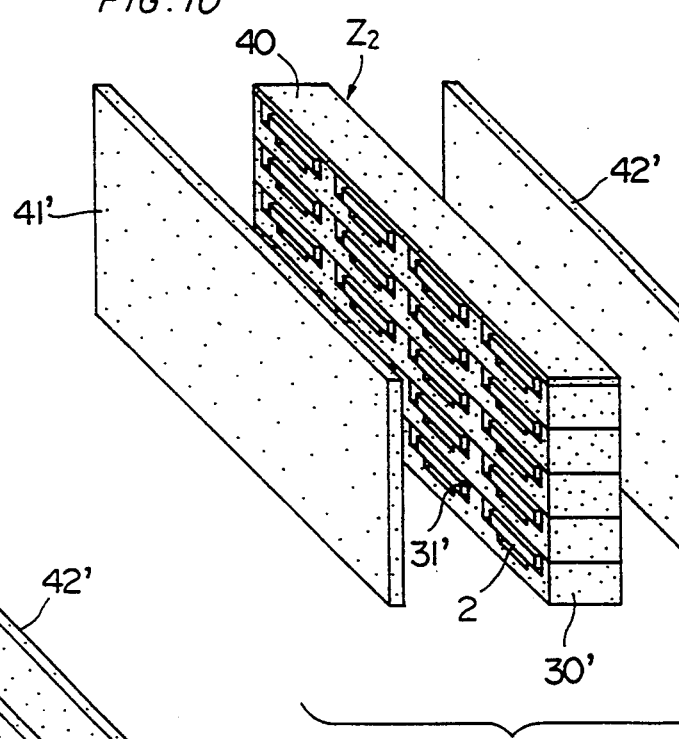
FIG. 10 is a perspective view showing a step next to FIG. 9.
Figure 11:
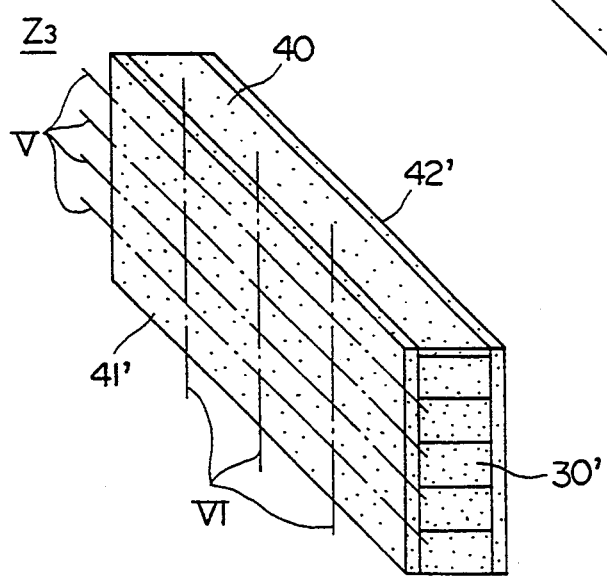
FIG. 11 is a perspective view showing a step following the step of FIG. 10.

FIGS. 9 to 11 show a manufacturing method according to a third embodiment of the present invention.

In this method as shown FIG. 9, the mother element 2A is fixed into each of the storing grooves 31' by conductive adhesive, and a plurality of such mother base plates 30' are layered and bonded one after another, so as to form a first layered unit $Z_1$. A mother cover plate 40 is bonded to an upper surface of the uppermost mother base plate 30'. The first unit $Z_1$ prepared in the aforementioned manner is cut in a direction perpendicular to a lengthwise direction of the storing grooves 31' and in a single chip width along the lines IV—IV so as to obtain second layered units $Z_2$ as shown in FIG. 10.

The mother base plates 30' used in this embodiment have substantially the same shape as that of the mother base plate 30 used in the second embodiment. However, the thickness of the bottom portion of each mother base plate 30' which corresponds to a thickness 1 below the spacing groove 33 in FIG. 5, is set preferably about twice as long as that of a final product (see FIG. 1). Also, referring to the second and the third embodiments, the thickness t of each end wall 34 separating the storing grooves 31 (31') from each other is preferably set about twice as long as that of a final product.

As shown FIG. 11, mother side plates 41' and 42' are bonded to the side surfaces of the second unit $Z_2$ where the storing grooves 31' are opened, so as to obtain a third layered unit $Z_3$. At this time, vibration spaces are defined between these side plates 41' and 42' and the element 2.

Thereafter, the unit $Z_3$ is cut in directions parallel to the lengthwise direction of the storing grooves 31' and in a single chip width and in a single chip height along the lines V—V and VI—VI in order to obtain completed chips. Then external electrodes are formed on outer surfaces of each of the completed chips, thereby a piezoelectric resonator as shown in FIG. 1 is obtained.

According to this embodiment, since a plurality of mother base plates 30' are layered one after another and wide mother side plates 41' and 42' are bonded thereto, mass productivity is further improved to attain reduction in cost.

Figure 12:
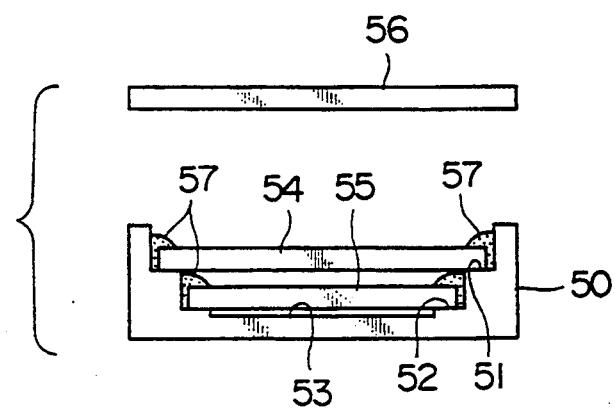
FIG. 12 is a side elevational view showing a piezoelectric resonator according to a fourth embodiment of the present invention.
Figure 13:
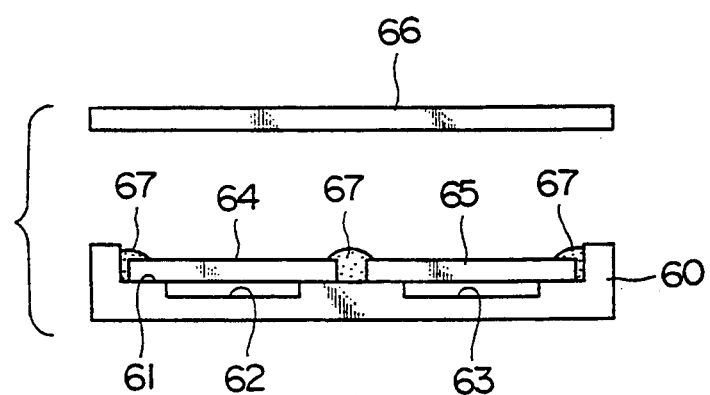
FIG. 13 is a side elevational view showing a piezoelectric resonator according to a fifth embodiment of the present invention.

FIGS. 12 and 13 show piezoelectric resonators according to a fourth and fifth embodiments of the present invention.

The piezoelectric resonator shown in FIG. 12 has a first storing groove 51 which is formed in an upper surface of a base plate 50, a second storing groove 52 which is formed in a central portion of the bottom of the first storing groove 51, and a spacing groove 53 which is formed in a central portion of the bottom of the second storing groove 52. A first resonator element 54 is placed and fixed on the bottom of the first storing groove 51, and a second resonator element 55 is placed and fixed on the bottom of the second storing groove 52 by conductive adhesive 57. Internal electrodes (not shown) are formed on the bottoms of the first and the second storing grooves 51 and 52. An upper surface of the base plate 50 is covered with a cover plate 56, and both side surfaces thereof are covered with two side plates (not shown). Structures of other portions and a manufacturing method of this piezoelectric resonator are similar to those of the aforementioned embodiments.

According to this embodiment, it is possible to seal the two resonator elements 54 and 55, which are connected in parallel, in a single base plate 50.

The piezoelectric resonator shown in FIG. 13 has a wide storing groove 61 which is formed in a base plate 60, and two parallel spacing grooves 62 and 63 which are formed in the bottom of the storing groove 61. Two resonator elements 64 and 65 are fixed by conductive adhesive 67 over the spacing grooves 62 and 63 respectively, and an upper surface of the base plate 60 is covered with a cover plate 66. Both side surfaces of the base plate 60 are covered with two side plates (not shown).

According to this embodiment, it is possible to seal the two resonator elements 64 and 65, which are connected in series, in a single base plate 60.

Though each of the embodiments has been described with reference to a resonator element vibrating in a thickness shear slide mode, the present invention is also applicable to a resonator element of another vibration mode such as a thickness expansion mode.

Further, although the base plate is provided with the spacing groove in addition to the storing groove to define vibration space around the lower vibration electrode of the resonator element, such a spacing groove may be omitted by forming adhesive layers on both end portions of the bottom of the storing groove in a certain thickness.

The conductive adhesive is not restricted to liquid type, but may be prepared from a sheet type, for example. In this case, it becomes easy to control the location of the sheet type adhesive toward the storing groove, the amount of the adhesive, and the handling thereof. Thus, automation is simplified so as to further reduce the manufacturing cost.

Even though two external electrodes used as input and output terminals are described in the above-mentioned embodiments, another external electrode used for a ground terminal may be formed in addition to these electrodes. In this case, when capacitances are formed both between the input terminal and the ground terminal and between the output terminal and the ground terminal, a resonator containing capacitors which is preferable for a Colpitts oscillator can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a plurality of piezoelectric resonator chips, comprising the steps of:
    obtaining a mother resonator element having a piezoelectric ceramic substrate, vibrating electrodes formed on opposing surfaces of said substrate, and lead electrodes formed on said substrate to extend from said vibrating electrodes toward opposing ends of said substrate;
    obtaining a mother base plate which has end walls and a storing groove in an upper surface thereof for storing said mother resonator element;
    forming internal electrodes extending from end portions of said storing groove toward upper surfaces of said end walls of said mother base plate;
    fixing said mother resonator element onto said end portions of said storing groove thereby connecting said lead electrodes of said mother resonator element with said internal electrodes of said mother base plate;
    bonding a mother cover plate onto said mother base plate so as to cover an upper opening of said storing groove, thereby obtaining an intermediate unit;
    cutting said intermediate unit in a direction perpendicular to a lengthwise direction of said storing groove and in a single chip width, thereby obtaining a plurality of intermediate piezoelectric resonator chips;
    bonding side plates to side surfaces of each of said intermediate chips so as to cover side openings of said storing groove, thereby obtaining completed piezoelectric resonator chips; and
    forming external electrodes on outer surfaces of each of said completed piezoelectric resonator chips to be connected with said internal electrodes.

2. A manufacturing method in accordance with claim 1, further comprising the step of:
    forming a continuous spacing groove in a central portion of said storing groove for defining a vibration space.

3. A manufacturing method in accordance with claim 1, wherein
said mother resonator element has electrodes which comprise said vibrating electrodes and said lead electrodes, and which are formed to be continuous on said opposing surfaces of said piezoelectric ceramic substrate, so as to be cut into a plurality of resonator elements vibrating in a thickness shear slide mode.

4. The method of claim 1, wherein said step of fixing said mother resonator element onto said end portions of said storing groove comprises a step of using a conductive adhesive to fix said mother resonator element onto said end portions of said storing groove to thereby connect the lead electrodes of the mother resonator element with the internal electrodes formed on the mother base plate.

5. The method of claim 1, wherein a resonator element in each of said piezoelectric resonator chips is completely covered by a cut portion of each of said mother base plate, said mother cover plate and said side plates so that the resonator element in each of the piezoelectric resonator chips is not exposed on an outer surface thereof.

6. A method of manufacturing a plurality of piezoelectric resonator chips, comprising the steps of:
obtaining a plurality of mother resonator elements each of which has a piezoelectric ceramic substrate, vibrating electrodes formed on opposing surfaces of said substrate, and lead electrodes formed on said substrate to extend from said vibrating electrodes toward opposing ends of said substrate;
obtaining a mother base plate which has end walls and a plurality of storing grooves arranged in parallel and located in an upper surface of said mother base plate for storing said mother resonator elements;
forming internal electrodes extending from end portions of each of said storing grooves toward upper surfaces of said end walls of said mother base plate;
fixing each of said mother resonator elements onto said storing grooves thereby connecting said lead electrodes of said mother resonator elements with said internal electrodes of said mother base plate;
bonding a mother cover plate onto said mother base plate so as to cover upper openings of said storing grooves, thereby obtaining a first unit;
cutting said first unit in a direction perpendicular to a lengthwise direction of said storing grooves and in a single chip width, thereby obtaining a second unit;
bonding mother side plates onto side surfaces of said second unit so as to cover side openings of said storing grooves, thereby obtaining a third unit;
cutting said third unit in a direction parallel to said lengthwise direction of said storing grooves and in a single chip length, thereby obtaining a plurality of completed piezoelectric resonator chips; and
forming external electrodes on outer surfaces of each of said completed piezoelectric resonator chips to be connected with said internal electrodes.

7. A manufacturing method in accordance with claim 6, further comprising the step of:
forming a spacing groove in a central portion of said storing grooves for defining a vibration space.

8. A manufacturing method in accordance with claim 6, wherein
each of said mother resonator elements has electrodes which comprise said vibrating electrodes and said lead electrodes, and which are formed to be continuous on said opposing surfaces of said piezoelectric ceramic substrate, so as to be cut into a plurality of resonator elements vibrating in a thickness shear slide mode.

9. The method of claim 6, wherein said step of fixing said mother resonator elements onto said end portions of said storing grooves comprises a step of using a conductive adhesive to fix said mother resonator elements onto said end portions of said storing grooves to thereby connect the lead electrodes of the mother resonator elements with the internal electrodes formed on the mother base plate.

10. The method of claim 6, wherein a resonator element in each of said piezoelectric resonator chips is completely covered by a cut portion of each of said mother base plate, said mother cover plate and said mother side plates so that the resonator element in each of the piezoelectric resonator chips is not exposed on an outer surface thereof.

11. A method of manufacturing a plurality of piezoelectric resonator chips, comprising the steps of:
obtaining a plurality of mother resonator elements each of which has a piezoelectric ceramic substrate, vibrating electrodes formed on opposing surfaces of said substrate, and lead electrodes formed on said substrate to extend from said vibrating electrodes toward opposing ends of said substrate;
obtaining a plurality of mother base plates each of which has end walls and a plurality of storing grooves arranged in parallel and located in an upper surface of said base plate for storing said mother resonator elements;
forming internal electrodes extending from end portions of each of said storing grooves toward upper surfaces of said end walls of said mother base plates;
fixing each of said mother resonator elements onto said storing grooves thereby connecting said lead electrodes of said mother resonator elements with said internal electrodes of said mother base plates;
bonding said mother base plates in layers with said mother resonator elements fixed therein and bonding a mother cover plate onto said upper surfaces of said end walls of a top one of said mother base plates so as to cover upper openings of said storing grooves, thereby obtaining a first layered unit;
cutting said first layered unit in a direction perpendicular to a lengthwise direction of said storing grooves and in a single chip width, thereby obtaining a second layered unit;
bonding mother side plates onto side surfaces of said second layered unit so as to cover side openings of said storing grooves, thereby obtaining a third layered unit;
cutting said third layered unit in directions parallel to said lengthwise direction of said storing grooves in a single chip length and in a single chip height, thereby obtaining a plurality of completed piezoelectric resonator chips; and
forming external electrodes on outer surfaces of each of said completed piezoelectric resonator chips to be connected with said internal electrodes.

12. A manufacturing method in accordance with claim 11, further comprising the step of:

forming a spacing groove in a central portion of each of said storing grooves for defining a vibration space.

13. A manufacturing method in accordance with claim 11, wherein
each of said mother resonator elements has electrodes which comprise said vibrating electrodes and said lead electrodes, and which are formed to be continuous on said opposing surfaces of said piezoelectric ceramic substrate, so as to be cut into a plurality of resonator elements vibrating in a thickness shear slide mode.

14. The method of claim 11, wherein said step of fixing said mother resonator elements onto said end portions of said storing grooves comprises a step of using a conductive adhesive to fix said mother resonator elements onto said end portions of said storing grooves to thereby connect the lead electrodes of the mother resonator elements with the internal electrodes formed on the mother base plates.

15. The method of claim 5, wherein a resonator element in each of said piezoelectric resonator chips is completely covered by a cut portion of each of said mother base plate, said mother cover plate and said mother side plates so that the resonator element in each of the piezoelectric resonator chips is not exposed on an outer surface thereof.

* * * * *